US009660642B2

(12) United States Patent
Chen et al.

(10) Patent No.: US 9,660,642 B2
(45) Date of Patent: May 23, 2017

(54) EXPANSION CONTROL CIRCUIT

(71) Applicants:HONG FU JIN PRECISION INDUSTRY (ShenZhen) CO., LTD., Shenzhen (CN); HON HAI PRECISION INDUSTRY CO., LTD., New Taipei (TW)

(72) Inventors: Po-Jung Chen, New Taipei (TW); Meng-Liang Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 123 days.

(21) Appl. No.: 14/806,240

(22) Filed: Jul. 22, 2015

(65) Prior Publication Data

US 2017/0012620 A1    Jan. 12, 2017

(30) Foreign Application Priority Data

Jul. 7, 2015    (CN) .......................... 2015 1 0393017

(51) Int. Cl.
| | |
|---|---|
| *H03K 17/687* | (2006.01) |
| *H03K 17/284* | (2006.01) |
| *H03K 5/13* | (2014.01) |
| *H03K 5/00* | (2006.01) |
| *H03K 17/0812* | (2006.01) |
| *H03K 17/13* | (2006.01) |

(Continued)

(52) U.S. Cl.
CPC ............. *H03K 17/284* (2013.01); *H03K 5/13* (2013.01); *H03K 17/04106* (2013.01); *H03K 17/04163* (2013.01); *H03K 17/08122* (2013.01); *H03K 17/133* (2013.01); *H03K 17/223* (2013.01); *H03K 2005/00013* (2013.01)

(58) Field of Classification Search
None
See application file for complete search history.

(56) References Cited

U.S. PATENT DOCUMENTS

2004/0100147 A1* 5/2004 Chang .................. H03K 17/162
                                                                307/44
2013/0265084 A1* 10/2013 Callanan .............. H03K 17/063
                                                                327/109

(Continued)

*Primary Examiner* — Tuan T Lam
(74) *Attorney, Agent, or Firm* — Steven Reiss

(57) ABSTRACT

An expansion control circuit includes a delay circuit coupled to a first expansion module and a switching circuit coupled to a second expansion module. The switching circuit includes a buffer and a switching module. The buffer is coupled to the first expansion module. The first expansion module outputs a first control signal upon being switched on and outputs a second control signal after a working time. The delay circuit outputs a disconnecting signal upon being switched on. The buffer is switched off upon receiving the disconnect signal. The delay circuit further outputs a connecting signal after a delay time after outputting the disconnecting signal. The buffer is switched on upon receiving the connect signal. The buffer further outputs the second control signal to the switching module upon being switched on. The switching module controls the second expansion module to be switched on v receiving the second control signal.

20 Claims, 2 Drawing Sheets

(51) Int. Cl.
    *H03K 17/041*     (2006.01)
    *H03K 17/0416*     (2006.01)
    *H03K 17/22*     (2006.01)

(56) References Cited

U.S. PATENT DOCUMENTS

2016/0149568 A1*   5/2016   Lee .................. H03K 17/04106
    327/374
2016/0149570 A1*   5/2016   Xiong ................ H03K 17/6871
    327/404

* cited by examiner

EXPANSION CONTROL CIRCUIT

FIELD

The subject matter herein generally relates to control circuits.

BACKGROUND

An expansion control circuit may used to control expanders to be reset.

BRIEF DESCRIPTION OF THE DRAWINGS

Implementations of the present technology will now be described, by way of example only, with reference to the attached figures.

DETAILED DESCRIPTION

Figure 1:
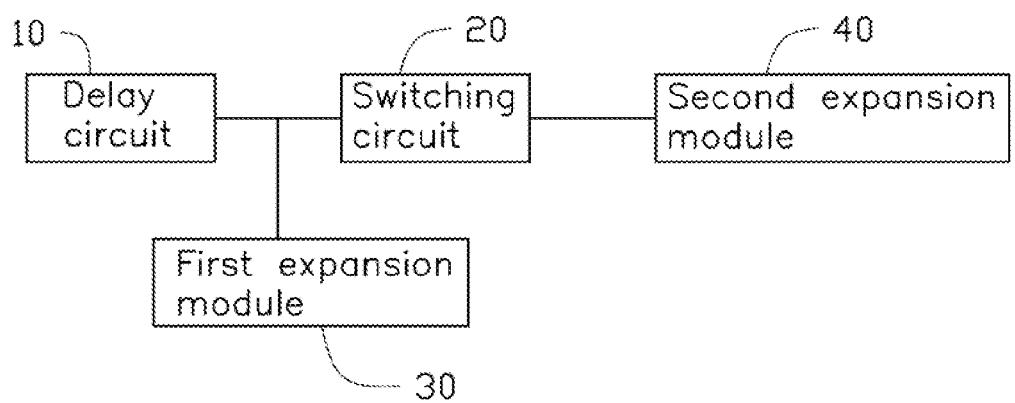
FIG. 1 is a block diagram of one embodiment of an expansion control circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

The present disclosure is described in relation to an expansion control circuit to control expanders.

FIG. 1 illustrates an embodiment of an expansion control circuit. The expansion control circuit comprises a delay circuit 10 and a switching circuit 20. The delay circuit 10 is configured to couple to a first expansion module 30. The switching circuit 20 is configured to couple to a second expansion module 40.

Figure 2:
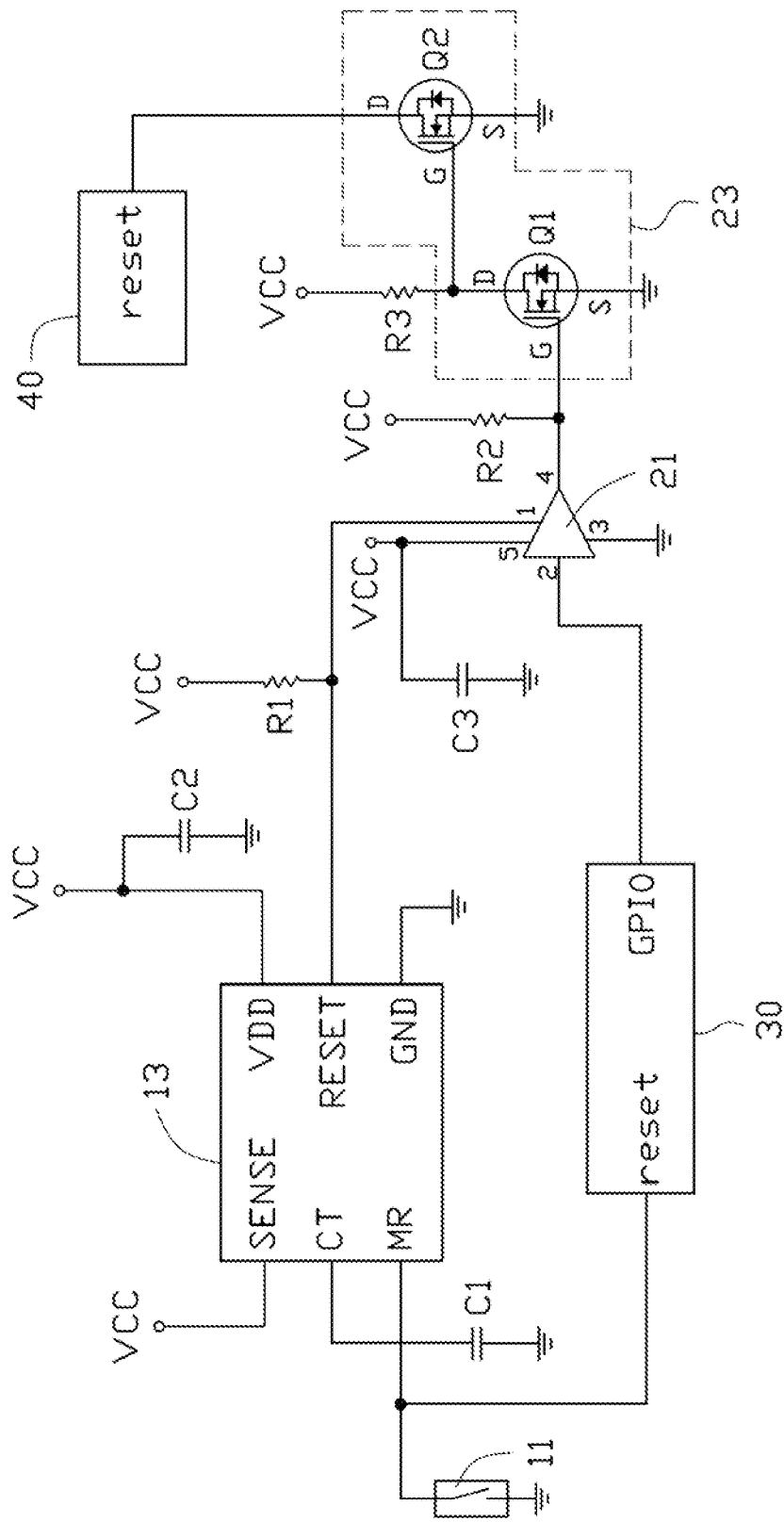
FIG. 2 is a circuit diagram of the expansion control circuit of FIG. 1.

FIG. 2 illustrates that the delay circuit 10 comprises a switching member 11, a delay chip 13, a first capacitor C1, and a second capacitor C2. The delay chip 13 comprises a reset terminal RESET, a ground terminal GND, an automatic reset terminal MR, a connecting terminal CT, a power supply input terminal SENSE, and a power supply terminal VDD. In at least one embodiment, a type of the delay chip 13 is TPS380G33DBVR.

The switching circuit 20 comprises a buffer 21 and a switching module 23. The switching module 23 comprises a first field effect transistor (FET) Q1 and a second FET Q2. The buffer 21 comprises a connecting terminal 1, a receiving terminal 2, a ground terminal 3, a sending terminal 4, and a power supply terminal 5. Each first FET Q1 and second FET Q2 is an n-channel metal-oxide semiconductor (MOS), and comprises a gate terminal G, a source terminal S, and a drain terminal D. In at least one embodiment, a type of the buffer 21 is SN74LVCG126DBVR.

The first expansion module 30 comprises a reset terminal reset and a general purpose input output (GPIO) terminal. The second expansion module 40 comprises a reset terminal reset. The first expansion module 30 and the second expansion module 40 are configured to be switched on and be reset after receiving a low level signal, output a first control signal after being reset, and output a second signal after a working time after being reset. In at least one embodiment, the first control signal is a low level signal and the second control signal is a high level signal.

The reset terminal RESET of the delay chip 13 is coupled to a power supply VCC via a first resistor R1. The ground terminal GND of the delay chip 13 is grounded. The automatic reset terminal MR of the delay chip 13 is grounded via the switching member 11. The automatic reset terminal MR of the delay chip 13 is coupled to the reset terminal reset of the first expansion module 30. The connecting terminal CT of the delay chip 13 is grounded via a first capacitor C1. The power supply input terminal SENSE of the delay chip 13 is coupled to the power supply VCC. The power supply terminal VDD of the delay chip 13 is coupled to the power supply VCC. The power supply terminal VDD of the delay chip 13 is grounded via a second capacitor C2.

The reset terminal RESET of the delay chip 13 is coupled to a connecting terminal 1 of the buffer 21. The general purpose input output terminal GPIO of the first expansion module 30 is coupled to a receiving terminal 2 of the buffer 21. A ground terminal 3 of the buffer 21 is grounded. A sending terminal 4 of the buffer 21 is coupled to the power supply VCC via a second resistor R2. The sending terminal 4 of the buffer 21 is coupled to the gate terminal G of the first FET Q1. A power supply terminal 5 of the buffer 21 is coupled to the power supply VCC. The power supply terminal 5 of the buffer 21 is grounded via a third capacitor C2.

The source terminal S of the first FET Q1 is grounded. The drain terminal D of the first FET Q1 is coupled to the gate terminal G of the second FET Q2. The gate terminal G of the second FET Q2 is coupled to the power supply VCC via a third resistor R3. The source terminal S of the second FET Q2 is grounded. The drain terminal D of the second FET Q2 is coupled to the reset terminal reset of the second expansion module 40.

After the switching member 11 is switched on, the reset terminal reset of the first expansion module 30 is grounded to receive a reset signal, thereby enabling the first expansion module 30 to be switched on and be reset. The first expansion module 30 outputs a first control signal via the general purpose input output terminal GPIO after being reset. The delay chip 13 is switched on and outputs a disconnect signal to the buffer 21. The buffer 21 is switched off after receiving the disconnecting signal, thereby stopping the first control signal from being output via the buffer 21. The first FET Q1 is switched on after the buffer 21 is switched off, thereby the second FET Q2 is switched off to output a third control signal to the second expansion module 40. The second expansion module 40 is switched off after receiving the second control signal. After a delay time T2, the delay chip 13 outputs a connecting signal. After receiving the connecting signal the buffer 21 is switched on. The buffer 21 receives the second control signal from the first expansion module 30 and outputs the second control signal. After receiving the second control signal the first FET Q1 is switched off, thereby enabling the second FET Q2 to be switched on and output a fourth control signal. The second expansion module 40 is switched on after receiving the fourth control signal. In at least one embodiment, the reset signal is a low level signal, the disconnecting signal is a low level signal, the connecting signal is a high level signal, the third control signal is a high level signal, the fourth control signal is a low level signal, and the working time T1 is equal to or less than the delay time T2.

In the expansion control circuit, the first expansion module 30 outputs the first control signal after being switched. After the delay time T2, the first expansion module 30 outputs the second control signal, the delay circuit 10 outputs the connecting signal to control the buffer 21 to be switched on. The buffer 21 outputs the second control signal to the switching module 23 after being switched on, thereby enabling the switching module 23 to control the second expansion module 40 to be switched on. The first expansion module 30 is capacity of controlling the second expansion module 40 to be switched on/off via the delay circuit 10 and the switching circuit 20.

In one embodiment, each resistance of the first resistor R1, the second resistor R2 and, the third resistor R3 is 4.7 KΩ, a capacitance of the first capacitor C1 is 470 nF, each capacitance of the second capacitor C2 and the third capacitor C3 is 0.1 uF, and the delay chip 13 is configured to output the delay time T2=1+(470/175)=3.68 s.

It is to be understood that even though numerous characteristics and advantages have been set forth in the foregoing description of embodiments, together with details of the structures and functions of the embodiments, the disclosure is illustrative only and changes may be made in detail, including in the matters of shape, size, and arrangement of parts within the principles of the disclosure to the full extent indicated by the broad general meaning of the terms in which the appended claims are expressed.

What is claimed is:

1. An expansion control circuit comprising:
   a delay circuit, having a delay time, configured to couple to a first expansion module; and
   a switching circuit having:
      a buffer configured to couple to the first expansion module, and
      a switching module configured to couple to a second expansion module;
   wherein the first expansion module is configured to:
      output a first control signal upon being switched on, and
      output a second control signal after a preset working time;
   wherein the delay circuit is configured to:
      enable the buffer to be switched off subsequent to being switched on, and
      enable the buffer to be switched on subsequent to being switched off;
   wherein the buffer is configured to output the second control signal to the switching module upon being switched on; and
   wherein the switching module is configured to control the second expansion module to be switched on upon receiving the second control signal.

2. The expansion control circuit of claim 1, wherein the switching module comprises a first field effect transistor (FET) and a second FET, the first FET is switched off after receiving the second control signal, and the second FET is switched on after the first FET is switched off.

3. The expansion control circuit of claim 2, wherein the second FET is configured to output a third control after being switched on and the second expansion module is configured to be switched on after receiving the third control signal.

4. The expansion control circuit of claim 3, wherein the third control signal is a low level signal.

5. The expansion control circuit of claim 2, wherein the first FET is an n-channel metal-oxide semiconductor (MOS).

6. The expansion control circuit of claim 5, wherein the second FET is an n-channel MOS, a drain terminal of the first FET is coupled to a gate terminal of the second FET, and a drain terminal of the second FET is configured to the second expansion module.

7. The expansion control circuit of claim 6, wherein the buffer comprises a receiving terminal and a sending terminal, the receiving terminal is configured to couple to the first expansion module, and the sending terminal is configured to couple to a gate terminal of the first FET.

8. The expansion control circuit of claim 1, wherein the preset working time is equal to or less than the delay time.

9. The expansion control circuit of claim 1, wherein the delay circuit comprises a delay chip coupled to the buffer, the delay chip is configured to couple to the first expansion module, the delay chip is configured to output a disconnecting signal after being switched on and is configured to output a connecting signal after the delay time, and the buffer is configured to be switched off after receiving the disconnecting signal and be switched on receiving the connecting signal.

10. The expansion control circuit of claim 9, wherein the delay circuit further comprises a switching member, the switching member is coupled to the delay chip, and the delay chip is configured to be switched on after the switching member is switched on.

11. An expansion control circuit comprising:
   a delay circuit configured to couple to a first expansion module; and
   a switching circuit having:
      a buffer configured to couple to the first expansion module, and
      a switching module configured to couple to a second expansion module;
   wherein the first expansion module is configured to:
      output a first control signal upon being switched on, and
      output a second control signal after a preset working time;
   wherein the delay circuit is configured to:
      output a disconnecting signal upon being switched on, and
      output a connecting signal after a delay time after outputting the disconnecting signal;
   wherein the buffer is configured to:
      be switched off upon receiving the disconnecting signal,
      be switched on upon receiving the connecting signal, and output the second control signal to switching module upon being switched on; and wherein the switching module is configured to control the second expansion module to be switched on upon receiving the second control signal.

12. The expansion control circuit of claim 11, wherein the switching module comprises a first field effect transistor (FET) and a second FET, the first FET is switched off after receiving the second control signal, and the second FET is switched on after the first FET is switched off.

13. The expansion control circuit of claim 12, wherein the first FET is an n-channel metal-oxide semiconductor (MOS).

14. The expansion control circuit of claim 13, wherein the second FET is an n-channel MOS, a drain terminal of the first FET is coupled to a gate terminal of the second FET, and a drain terminal of the second FET is configured to the second expansion module.

15. The expansion control circuit of claim 13, wherein the buffer comprises a receiving terminal and a sending terminal, the receiving terminal is configured to couple to the first expansion module, and the sending terminal is configured to couple to a gate terminal of the first FET.

16. The expansion control circuit of claim 11, wherein the preset working time is equal to the delay time.

17. The expansion control circuit of claim 11, wherein the delay circuit comprises a delay chip coupled to the buffer, the delay chip is configured to couple to the first expansion module, and the delay chip is configured to output the disconnecting signal after being switched on and is configured to output the connecting signal after the delay time.

18. The expansion control circuit of claim 17, wherein the delay circuit further comprises a switching member, the switching member is coupled to the delay chip, and the delay chip is configured to be switched on after the switching member is switched on.

19. The expansion control circuit of claim 11, wherein the first control signal is a low level signal.

20. The expansion control circuit of claim 11, wherein the second control signal is a high level signal.

* * * * *